United States Patent [19]

McDougall

[11] 4,040,173

[45] Aug. 9, 1977

[54] FORMERS FOR COILS

[75] Inventor: Ian Leitch McDougall, Aldridge, England

[73] Assignee: Imperial Metal Industries (Kynoch) Limited, Birmingham, England

[21] Appl. No.: 622,158

[22] Filed: Oct. 14, 1975

[30] Foreign Application Priority Data

Oct. 15, 1974 United Kingdom ............... 44599/74

[51] Int. Cl.[2] ............................................ H01L 39/08

[52] U.S. Cl. ........................................ 29/599; 29/605; 148/11.5 R; 148/133; 427/62

[58] Field of Search ......................... 29/132, 599, 605; 432/252, 260; 427/62; 148/11.5, 133

[56] References Cited

U.S. PATENT DOCUMENTS

| | | | |
|---|---|---|---|
| 2,663,558 | 12/1953 | Ornitz et al. | 148/31.5 |
| 3,429,032 | 2/1969 | Martin et al. | 29/599 |
| 3,876,473 | 4/1975 | McDougall | 148/11.5 |

OTHER PUBLICATIONS

Harwell Scientific Services, 1973, "Multi Filamentary $Nb_3Sn$ Superconductor," 7 pp.

*Primary Examiner*—Arthur J. Steiner
*Attorney, Agent, or Firm*—Cushman, Darby & Cushman

[57] ABSTRACT

A former for a magnetic coil, particularly a superconducting magnet of the filamentary intermetallic wire type in which the coil is wound green and reacted after winding, the former being typically of stainless steel having an alumina coating flame sprayed onto its surface.

7 Claims, 2 Drawing Figures

FORMERS FOR COILS

BACKGROUND OF THE INVENTION

This invention relates to formers on which magnetic coils may be wound and has particular reference to formers for intermetallic superconducting wires.

Intermetallic superconducting wires are now becoming available in which the superconductor is in the form of filamentary intermetallic, ie, $Nb_3Sn$, compound. These wires have a limited radius through which they can be bent without damaging the intermetallic filaments. It is of course extremely well-known that intermetallic filaments are very brittle.

Conventionally, superconducting magnets are wound onto plastics formers using normal coil winding machinery. However, unless extreme care is taken during the winding operation, there is a danger that the wire will be bent to a radius small enough to cause damage to the intermetallic filaments. One way in which this can be prevented is to wind the wire green, ie unreacted, and to heat the wire on the former to a temperature greater than the minimum reaction temperature of the components of the intermetallic compound so as to form the intermetallic compound in situ on the coil.

However, using prior art formers of plastics material, the temperature needed to obtain a reaction is greater than the melting point of the former and thus the winding green option is not available.

SUMMARY OF THE INVENTION

By the present invention there is provided a former on which wire can be wound to produce a superconducting magnetic coil comprising a metallic cylinder having at least one end flange, the metal having a melting point greater than 1200° C, and having a coating thereon of a refractory material non-reactive with the metal, and non-reactive with the wire.

The metal may be steel, and may be stainless steel. The refractory coating may be a refractory oxide. The refractory oxide may be alumina. The refractory coating may be flame sprayed onto the metal substrate.

The present invention further provides a method of manufacturing a superconductive magnet which comprises the steps of winding onto a former a wire containing the components of a superconductive intermetallic compound, and heating the assembly to a temperature such that the components of the compound react to form the intermetallic compound, characterised in that the former is of metal having a melting point greater than the temperature at which the reaction is carried out, and has on all portions of its surface contacted by the wire a coating of a refractory material non-reactive with the metal and non-reactive with the wire.

The wire may contain, after reaction, filaments of the intermetallic compound. Adjacent strands in a single layer may be insulated one from the other by a refractory material. The refractory material may be an oxide or a carbide, or a material which, on heating, forms an oxide or a carbide.

Adjacent layers of strands may be insulated one from the other. The adjacent layers may be insulated by glass mats.

The former may be a cylinder having at least one flange on one end thereof. The metal may be steel, and may be stainless steel. The refractory coating may be a refractory oxide, such as alumina. The refractory coating may be flame sprayed onto the metal.

BRIEF DESCRIPTION OF THE DRAWINGS

By way of example, embodiments of the present invention will now be described with reference to the accompanying drawings in which.

DESCRIPTION OF THE PREFERRED EMBODIMENTS

Figure 1:
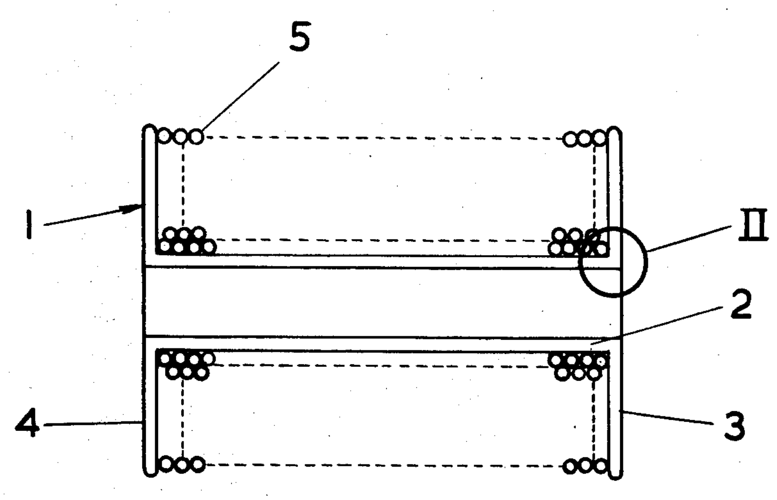
FIG. 1 is a cross-section of a former and coil.

Referring to FIG. 1, a stainless steel former 1 has a central cylindrical portion 2 and a pair of end flanges 3 and 4. Wound onto the former is a length of wire 5 which has a plurality of superconducting filaments embedded in it. The stainless steel former 1 has coated on its surface a layer 6 (see FIG. 2) of alumina. This alumina is coated onto the stainless steel surface by flame spraying. Normally, the alumina coating will only be put onto the former in those areas which are contacted by the wire 5. Effectively, this means the exterior of the cylindrical portion 2 and the interior faces of the flanges 3 and 4.

Figure 2:
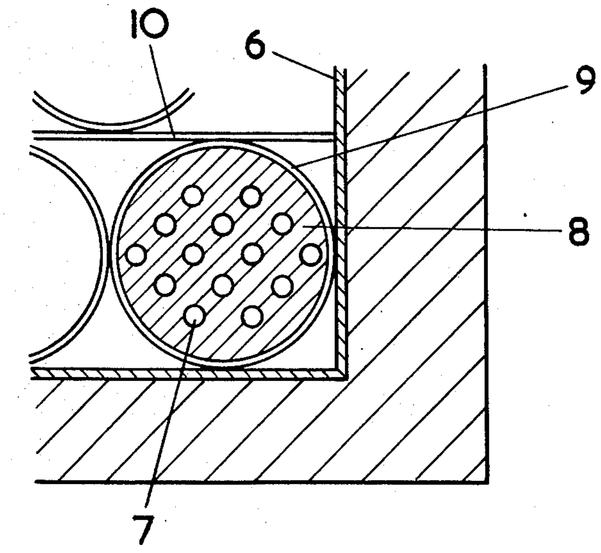
FIG. 2 is an enlargement of the portion of FIG. 1 within the circle II.

To manufacture the superconducting magnet, a length of wire of the type shown in FIG. 2 is wound onto the former which has previously been prepared by flame spraying alumina onto a stainless steel substrate. The wire basically consists in its green state of niobium filaments 7 embedded in a tin-containing matrix 8. The external surface of the wire has a diffusion resistant coating 9 thereon. Each layer of wire is separated from the next outer layer by a thin sheet 10 of glass fibre or other suitable insulating material. The wire, which can be manufactured by any suitable method, is wound in its unreacted state in which it is relatively strong and ductile. Normally, there will be no damage to the wire as a result of the winding. After winding the whole former and coil can be placed in an oven at a temperature in the range 600° to 800° C to diffuse tin into the niobium filaments to cause a reaction and to produce $Nb_3Sn$ filaments. This former and its coil may then be impregnated with an epoxy resin to prevent relative movement between adjacent strands of the wire.

The superconductive coil may then be used in a manner as required.

The materials of the former and the refractory layer may be chosen to suit any particular coil. For example, the former may be manufactured from titanium or a titanium alloy or from bronze or any other material resistant to the temperatures at which firing and reaction of the green wire takes place. The refractory non-reactive layer may be any suitable material other than alumina such as silica or carbon or a carbide or nitride as required. Clearly, methods other than flame spraying may be used to bond the layer onto the former.

The advantage of having the refractory insulating material bonded to the metallic cylinder is that the metal and refractory behave as a single integral item. Alternative formers may comprise tubes of metal having an outer glass tubular sheath. Such an item has a relatively large thickness of unwanted glass on its surface and also because of differential expansion rates between the glass and the metal, can cause problems in service. Similarly, asbestos sheathed tubes also have differential expansion rates between the asbestos and the metal and this causes problems in service. With a bonded structure, the thickness of the insulating material can be kept to a very low level. The insulating material will not simply fall off but will be permanently retained in situ. Clearly in a superconducting magnet, although necessary, resistance material is wasted as far as the generation of a magnetic foil is concerned. This means that the thinner the insulating material, the better from the point of view of the magnetic properties.

I claim:

1. A method of manufacturing a superconductive magnet which comprises the steps of winding onto a former a wire containing the components of a superconductive intermetallic compound, and heating the assembly to a temperature such that the components of the compound react to form the intermetallic compound, characterised in that the former is of metal having a melting point greater than the temperature at which the reaction is carried out, and has on all portions of its surface contacted by the wire a coating of a refractory material non-reactive with the metal and non-reactive with the wire.

2. A method as claimed in claim 1 in which the wire contains, after reaction, filaments of the intermetallic compound.

3. A method as claimed in claim 1 in which adjacent strands in a single layer are insulated one from the other by a refractory material.

4. A method as claimed in claim 3 in which the refractory material is chosen from the group an oxide, a carbide, or a material which, on heating, forms an oxide or a carbide.

5. A method as claimed in claim 1 in which adjacent layers of strands are insulated one from the other.

6. A method as claimed in claim 5 in which adjacent layers are insulated by glass mats.

7. A method of manufacturing a superconductive magnet comprising providing a former having a cylindrical metal body having radially projecting metal end flanges, winding onto the body between the flanges a wire containing the components of a superconductive intermetallic compound, and heating the assembly to a temperature such that the components of the compound react to form the intermetallic compound, the metal of the body and flanges having a melting point greater than the temperature at which the reaction is carried out, and having on all portions of their surfaces contacted by the wire a coating of a refractory material non-reactive with the metal and non-reactive with the wire.

* * * * *